United States Patent
Aoki et al.

(10) Patent No.: US 7,410,877 B2
(45) Date of Patent: Aug. 12, 2008

(54) METHOD FOR MANUFACTURING SIMOX WAFER AND SIMOX WAFER

(75) Inventors: Yoshiro Aoki, Tokyo (JP); Riyuusuke Kasamatsu, Tokyo (JP); Hideki Nishihata, Tokyo (JP); Seiichi Nakamura, Tokyo (JP)

(73) Assignee: Sumco Corporation, Tokyo (JP)

( * ) Notice: Subject to any disclaimer, the term of this patent is extended or adjusted under 35 U.S.C. 154(b) by 27 days.

(21) Appl. No.: 11/471,750

(22) Filed: Jun. 20, 2006

(65) Prior Publication Data

US 2007/0020949 A1    Jan. 25, 2007

(30) Foreign Application Priority Data

Jun. 23, 2005    (JP)    ............................. P2005-183864

(51) Int. Cl.
*H01L 21/331*    (2006.01)
*H01L 21/8222*    (2006.01)

(52) U.S. Cl. ...................... 438/311; 438/513; 438/766; 257/E21.32; 257/E21.311; 257/E21.319; 257/E21.321; 257/E21.563

(58) Field of Classification Search .................. 438/311, 438/506, 509, 513, 514, 766
See application file for complete search history.

(56) References Cited

U.S. PATENT DOCUMENTS

| | | | | |
|---|---|---|---|---|
| 5,196,355 A | * | 3/1993 | Wittkower | 438/766 |
| 5,310,689 A | * | 5/1994 | Tomozane et al. | 438/766 |
| 5,429,955 A | * | 7/1995 | Joyner et al. | 438/766 |
| 5,658,809 A | * | 8/1997 | Nakashima et al. | 438/766 |
| 5,918,136 A | | 6/1999 | Nakashima et al. | 438/404 |
| 5,918,151 A | | 6/1999 | Tachimori et al. | |
| 5,930,643 A | * | 7/1999 | Sadana et al. | 438/407 |
| 6,222,253 B1 | | 4/2001 | Sadana et al. | |
| 6,531,375 B1 | | 3/2003 | Giewont et al. | |

(Continued)

FOREIGN PATENT DOCUMENTS

EP    0926725 A    6/1999

(Continued)

OTHER PUBLICATIONS

European Search Report from European Application No. 06012767, mailed Aug. 24, 2007.

(Continued)

*Primary Examiner*—David Nhu
(74) *Attorney, Agent, or Firm*—Kolisch Hartwell, P.C.

(57) ABSTRACT

A method for manufacturing a SIMOX wafer includes: heating a silicon wafer, implanting oxygen ions so as to form a high oxygen concentration layer; implanting oxygen ions into the silicon wafer obtained by the forming of the high oxygen concentration layer to form an amorphous layer; and heat-treating the silicon wafer to form a buried oxide layer, wherein in the forming of the amorphous layer, the implantation of oxygen ions is carried out after preheating the silicon wafer to a temperature lower than the heating temperature of the forming of the high oxygen concentration layer. Alternatively, the method for manufacturing a SIMOX wafer includes: in the formation of the high oxygen concentration layer, implanting oxygen ions while heating a silicon wafer at a temperature of 300° C. or more; and in the formation of the amorphous layer, implanting oxygen ions after preheating the silicon wafer to a temperature of less than 300° C.

10 Claims, 3 Drawing Sheets

U.S. PATENT DOCUMENTS

| | | |
|---|---|---|
| 6,767,801 B2 | 7/2004 | Kawamura et al. |
| 2003/0087504 A1 | 5/2003 | Erokhin et al. |
| 2004/0013886 A1 | 1/2004 | Fox et al. |

FOREIGN PATENT DOCUMENTS

| | | |
|---|---|---|
| JP | H07-263538 | 10/1995 |
| JP | 2004055694 A | 2/2004 |
| TW | 423157 | 2/2001 |
| TW | 505993 | 10/2002 |
| WO | 00/16396 | 3/2000 |

OTHER PUBLICATIONS

Taiwanese Office Action with Search Report from corresponding Taiwanese Patent Application No. 095122315, search completed on Mar. 7, 2008. An English language translation of the Office Action is attached.

\* cited by examiner

AFTER IMPLANTATION OF OXYGEN IONS

AFTER HEAT TREATMENT

METHOD FOR MANUFACTURING SIMOX WAFER AND SIMOX WAFER

BACKGROUND OF THE INVENTION

1. Field of the Invention

The present invention relates to a method for manufacturing SIMOX (Separation by Implanted Oxygen) wafers and also to a SIMOX wafer. In particular, the present invention relates to a method for manufacturing SIMOX wafers by a modified low dose (MLD) process.

This application claims priority from Japanese Patent Application No. 2005-183864 filed on Jun. 23, 2005, the content of which is incorporated herein by reference.

2. Background Art

The SIMOX process is known as one of methods for manufacturing silicon-on-insulator (SOI) wafers. In accordance with the process, a buried oxide (BOX) layer can be formed by the following: oxygen atoms are implanted into a wafer, for example, at an implantation energy of about 200 keV and at a dose amount of about $2 \times 10^{18}$ atoms/cm$^2$, and then a heat treatment is conducted at a high temperature. In this SIMOX process, since the dose amount and the implantation energy can be closely controlled, the BOX layer and a SOI layer can be uniformly formed at predetermined thicknesses.

Substrates obtained at a dose amount of at least $10^{18}$ atoms/cm$^2$ are called "high-dose SIMOX wafers," and substrates obtained at a dose amount of $4 \times 10^{17}$/cm$^2$ or less are called "low-dose SIMOX wafers." Compared to the case of manufacturing the high-dose SIMOX wafers, in the case of manufacturing the low-dose SIMOX wafers, there is less occurrence of threading dislocations and the amount of time for implanting oxygen ions can be shortened; thereby, high-quality and low-cost SOI substrates can be manufactured. However, as the dose amount is reduced, the thickness of the BOX layer becomes thinner. Therefore, there is a risk of lowering the reliability of the BOX layer.

In order to solve this problem, the ITOX (Internal Thermal Oxidation) process was developed (Patent Document 1 and Non-Patent Document 1). In accordance with this ITOX process, the thickness of the BOX layer can be increased by the following: a heat treatment by which the thickness becomes a theoretical film thickness calculated from the dose amount of oxygen ions, is conducted in an argon gas atmosphere having an oxygen concentration less than 1%, and then a heat treatment is conducted in an argon atmosphere having an oxygen concentration of 1% or more.

By adopting the ITOX process, it is possible to increase the thickness of the BOX layer, to reduce pinholes in the BOX layer, and to lower irregularities or roughness at the surface of the SOI layer (a silicon single crystal layer on the surface of a substrate) and at the interface between the SOI layer and the BOX layer. Therefore, the quality of the low-dose SIMOX wafers can be significantly improved. However, even in the low-dose SIMOX process in which this technology is adopted, due to the large dose amount of oxygen ions, the ion-implantation takes several hours per batch. Moreover, since the ITOX process (i.e., specific heat treatment steps) is needed, productivity is decreased. Therefore, there is a problem to increase production costs.

With regard to the method for manufacturing SIMOX wafers, a process in which oxygen ions are implanted in two separate stages has been disclosed (Patent Document 2). In this two-stage oxygen ion implantation, oxygen ions are implanted into a silicon wafer at a large dose amount while the silicon wafer is in a heated state, and then the silicon wafer is cooled to about room temperature and oxygen ions are again implanted. In the first oxygen ion implantation, since the silicon wafer is heated, the surface of the silicon wafer is kept in the form of a silicon single crystal. In the second oxygen ion implantation, since the silicon wafer is held at a low temperature, an amorphous layer is formed. Then, the silicon wafer thus obtained is subjected to an oxidation treatment at a high temperature for a fixed length of time, thereby, a SOI structure is formed.

In this process, due to the heat treatment after the ion implantation, a high-density defect layer including polysilicon, twin crystal and stacking faults are formed from the amorphous layer. Since oxygen readily precipitates in a region in which this high-density defect layer is formed, it is possible to thicken the BOX layer up to about twice as thick as a theoretical film thickness anticipated from the dose amount of oxygen ions. Moreover, since the dose amount of oxygen ions can be reduced to a lower level than that in the ITOX process, productivity is improved and production costs can be reduced. SIMOX wafers manufactured by this process are referred to as MLD-SIMOX, which stands for "modified low dose SIMOX".

Meanwhile, in the above steps or some other manufacturing steps, defects may be formed in the surface of the silicon substrate and particles such as dust or the like may adhere to the surface of the SOI wafer. If the SOI wafer is used in subsequent steps while remaining in such an undesirable state, there is a risk of decreasing the production yield of devices fabricated from the SOI wafer. Hence, the SOI wafer is subjected to an inspection to detect particles. For example, the surface of the substrate is cleaned and dried, and then, the inspection of the SOI wafer is typically carried out by exposing a light onto the surface of the SOI wafer and using an apparatus such as a surface inspection system to detect particles.

In the above MLD-SIMOX wafer, when a BOX layer is formed, the roughness increases at the surface of the SOI layer and at the interface between the SOI layer and the BOX layer. This may make it impossible, in the above particle inspection, to distinguish between the roughness of the surface of the SOI layer and the particles.

It is therefore an object of the present invention to reduce the roughness at the surface of the SOI layer and the roughness at the interface between the SOI layer and the BOX layer in MLD-SIMOX wafers.

(Patent Document 1) Japanese Patent Application, First Publication No. H07-263538

(Patent Document 2) U.S. Pat. No. 5,930,643

(Non-Patent Document 1) S. Nakashima, et al., "Thickness Increment of Buried Oxide in a SIMOX Wafer by High-Temperature Oxidation", Proceedings of 1994 IEEE International SOI Conference, p. 71 to 72 (1994)

SUMMARY OF THE INVENTION

To achieve this object, we have conducted extensive investigations on the conditions of the second implantation of oxygen ions (the forming of the amorphous layer) which is carried out after lowering the temperature of the silicon wafer to about room temperature. As a result, we have discovered that when a silicon wafer which has been subjected to a first implantation of oxygen ions (the forming of the high oxygen concentration layer) and subsequently cooled to about room temperature is then preheated by raising the temperature to a given level and is subjected in this state to the second implantation of oxygen ions, the formation of amorphous silicon is suppressed, which enables the roughness at the surface of the SOI layer and at the interface between the SOI layer and the BOX layer to be reduced.

Accordingly, a first aspect of a method for manufacturing a SIMOX wafer of the present invention includes: while heating a silicon wafer, implanting oxygen ions so as to form a high oxygen concentration layer within the silicon wafer; implanting oxygen ions into the silicon wafer which is obtained by the forming of the high oxygen concentration layer so as to form an amorphous layer in the silicon wafer; and heat-treating the silicon wafer which is obtained by the forming of the amorphous layer so as to form a buried oxide layer, wherein in the forming of the amorphous layer, the implantation of oxygen ions is carried out after preheating the silicon wafer to a temperature lower than the heating temperature of the forming of the high oxygen concentration layer.

A second aspect of a method for manufacturing a SIMOX wafer of the present invention includes while heating a silicon wafer to 300° C. or more, implanting oxygen ions so as to form a high oxygen concentration layer within the silicon wafer; implanting oxygen ions into the silicon wafer which is obtained by the forming of the high oxygen concentration layer so as to form an amorphous layer in the silicon wafer; and heat-treating the silicon wafer which is obtained by the forming of the amorphous layer so as to form a buried oxide layer, wherein in the forming of the amorphous layer, the implantation of oxygen ions is carried out after preheating the silicon wafer to a temperature of less than 300° C.

This second aspect may also be regarded as an embodiment of the first aspect of the present invention in which the heating temperature in the forming of the high oxygen concentration layer is 300° C. or more and the preheating temperature in the forming of the amorphous layer is less than 300° C.

Regarding the forming of the amorphous layer, the thickness of the BOX layer becomes thinner in the case in which oxygen ions are implanted into the silicon wafer in a preheated state, compared to the case in which preheating is not carried out. Therefore, in the first and second aspects of the method for manufacturing a SIMOX wafer of the present invention, in the forming of the amorphous layer, oxygen ions may be implanted in a plurality of fractions. Thereby, the amorphous layer forming region is expanded in the thickness direction, which makes it possible to increase the thickness of the BOX layer. Each of the plurality of fractions of the ion-implantation may be carried out at the preheating temperature.

In the case in which oxygen ions are implanted in a plurality of fractions in the forming of the amorphous layer, the fractions of the implantation of oxygen ions may be carried out at different implantation energies. The implantation energy for oxygen ions correlates with the ion implantation depth. Therefore, in the case in which a large difference in the implantation energy is set between one of the plurality of the fractions of implantation of oxygen ions and other thereof, a distribution in the implantation depth of the oxygen ions broadens, thereby, the thickness of the amorphous layer increases, and, in turn, the thickness of the BOX layer can be thickened.

In accordance with the present invention, it is possible to reduce the roughness at the surface of the SOI layer in a MLD-SIMOX wafer and the roughness at the interface between the SOI layer and the BOX layer.

BRIEF DESCRIPTION OF THE DRAWINGS

FIG. 1A shows a cross-section of the wafer after implantation of oxygen ions, and FIG. 1B shows a cross-section of the SIMOX wafer obtained after a heat treatment.

DESCRIPTION OF THE PREFERRED EMBODIMENTS

Embodiments of the method for manufacturing a MLD-SIMOX wafer (referred to below as "SIMOX wafer" where appropriate) of the present invention are described in detail below in conjunction with the attached diagrams.

Figure 1A:
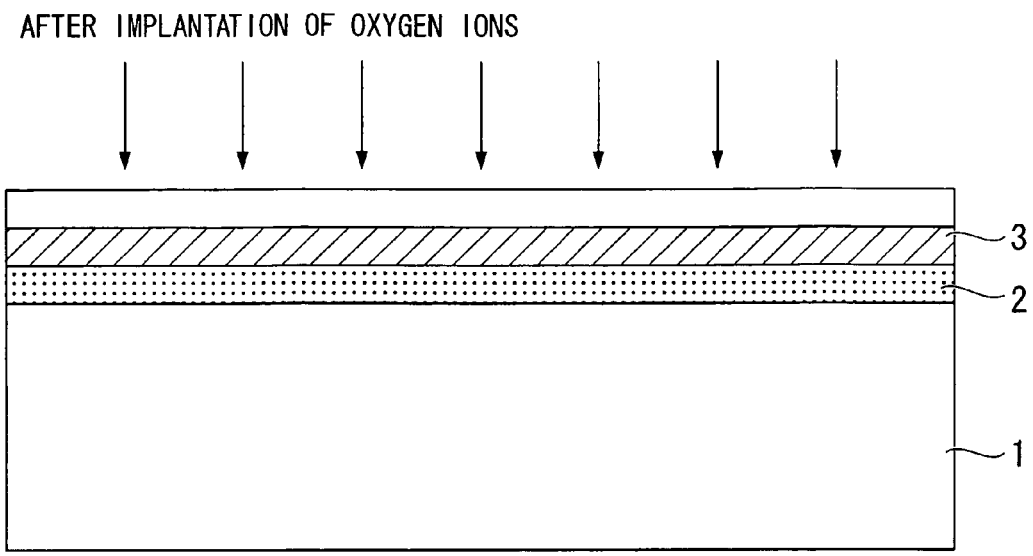
FIGS. 1A and 1B illustrates a method for manufacturing a SIMOX wafer by a MLD-SIMOX process in accordance with the present invention. In detail.
Figure 1B:
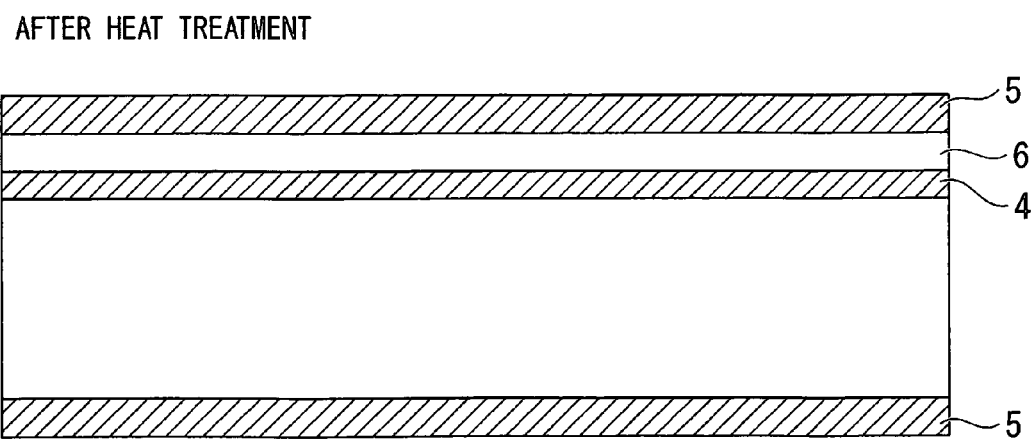

FIGS. 1A and 1B illustrate the method for manufacturing a SIMOX wafer by a MLD-SIMOX in accordance with the present invention.

The method for manufacturing a SIMOX wafer in accordance with this embodiment includes implanting oxygen ions into a silicon wafer 1 and heat-treating the silicon wafer. Implantation of oxygen ions is carried out in two stages. A first implantation of oxygen ions (a forming of a high oxygen concentration layer) is carried out while the silicon wafer 1 is heated at 300° C. or more, and preferably from 300 to 600° C. In the first implantation of oxygen ions, a dose amount of oxygen ions is $2\times10^{16}$ to $4\times10^{17}$ atoms/cm$^2$, and preferably $3\times10^{16}$ to $3\times10^{17}$ atoms/cm$^2$, and an implantation energy (acceleration energy) is in a range of 140 to 220 keV, and preferably 180 keV. After the first oxygen ion implantation, the silicon wafer 1 is cooled to, for example, a temperature close to room temperature, and then a second implantation of oxygen ions (a forming of an amorphous layer) is carried out while the silicon wafer 1 is in a state of being preheated at a preheating temperature of less than 300° C. In the second implantation of oxygen ions, a dose amount of oxygen ions is $1\times10^4$ to $5\times10^{16}$ atoms/cm$^2$, and preferably $1\times10^{15}$ to $1\times10^{16}$ atoms/cm$^2$ and an implantation energy is in a range of 140 to 220 keV, and preferably 180 keV.

FIG. 1A shows a cross-section of the wafer after the implantation of oxygen ions. The arrows schematically represent implantation of the oxygen ions. In the first implantation of oxygen ions, the silicon wafer 1 is heated to a relatively high temperature so as to form a high oxygen concentration layer 2 while maintaining the surface of the silicon wafer 1 as a silicon single crystal. In the second implantation of oxygen ions, the temperature is set to a lower level than that in the first implantation of oxygen ions so as to form an amorphous layer 3.

FIG. 1B shows a cross-section of the SIMOX wafer obtained after the heat treatment. In the heat treatment, the silicon wafer is heat-treated in a mixed gas atmosphere having a specific ratio of oxygen gas to inert gas (e.g., an oxygen partial pressure ratio of at least 5%) at a temperature of 1300° C. or more, preferably in a range of 1320 to 1350° C., for 6 to 12 hours. Thereby, a buried oxide (BOX) layer 4 is formed. Since a thickness of a surface oxide layer 5 is dependent on the oxygen partial pressure of the mixed gas and the heat treatment time, the thickness of the SOI layer (a silicon single crystal layer in the substrate surface) 6 can be controlled by adjusting the oxygen partial pressure and the heat treatment time. Nitrogen gas or argon gas is used as the inert gas which is mixed with the oxygen.

Figure 2:
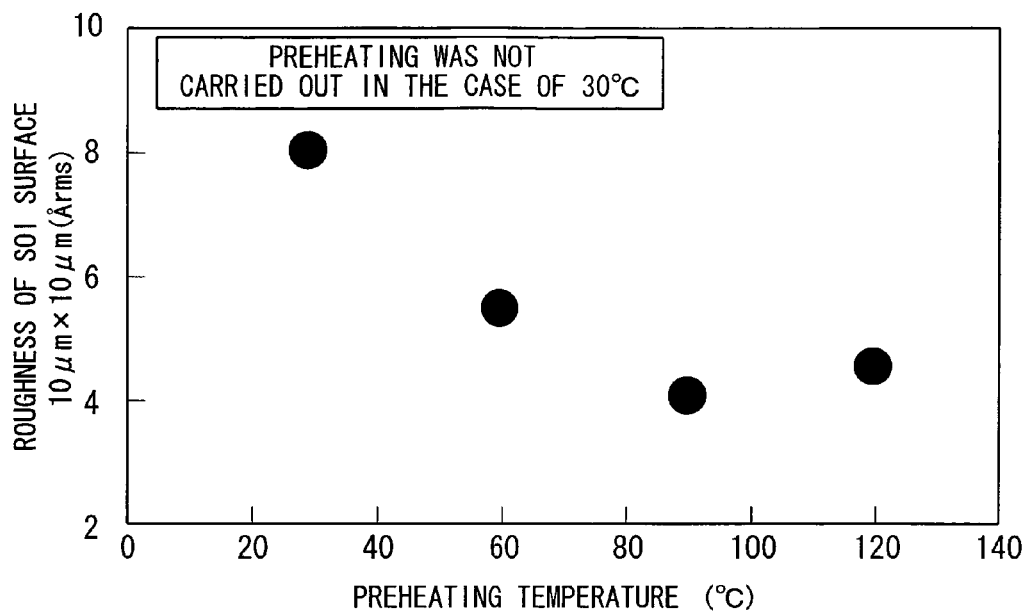
FIG. 2 is a graph showing the relationship between the preheating temperature in the forming of the amorphous layer and the roughness at the surface of the SOI layer in the method for manufacturing a SIMOX wafer by a MLD-SIMOX process in accordance with the present invention.
Figure 3:
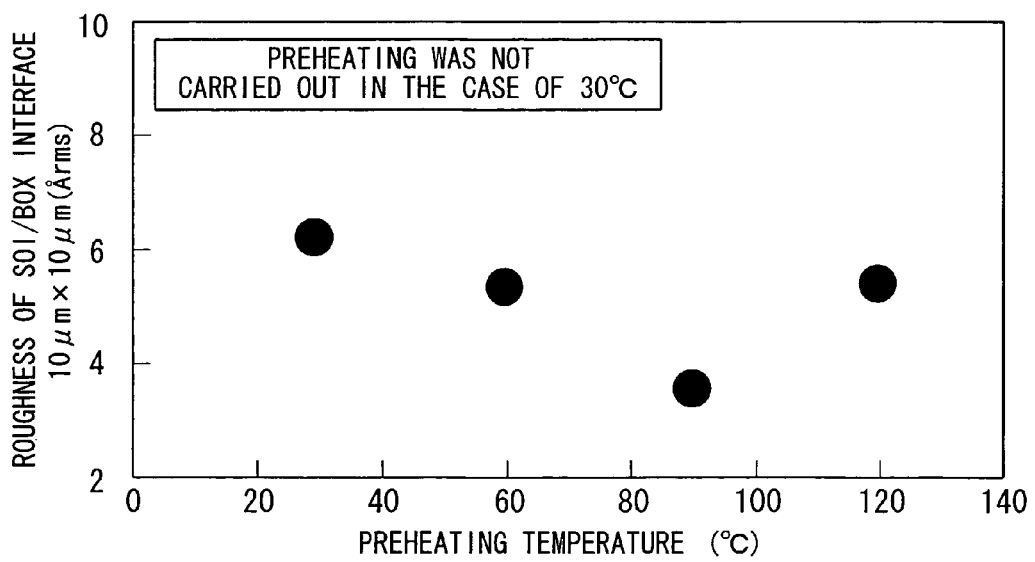
FIG. 3 is a graph showing the relationship between the preheating temperature in the forming of the amorphous layer and the roughness at the interface between the SOI layer and the BOX layer in the method for manufacturing a SIMOX wafer by a MLD-SIMOX process in accordance with the present invention.

Next, the influence that preheating of the silicon wafer 1 in the second implantation of oxygen ions (the forming of the amorphous layer 3) exerts on the roughness at the surface of the SOI layer and the roughness at the interface between the SOI layer and the BOX layer 4 is described while referring to FIGS. 2 and 3.

FIGS. 2 and 3 show the roughness (Å rms) at the surface of the SOI layer and at the interface between the SOI layer and the BOX layer of SIMOX wafers obtained under conditions in which a preheating temperature in the second implantation of oxygen ions was 60° C., 90° C. or 120° C. In each case, the first implantation of oxygen ions was carried out at a dose amount of $2 \times 10^{17}$ atoms/cm$^2$ and an implantation energy of 170 keV, and the second implantation of oxygen ions was carried out at a dose amount of $6 \times 10^{15}$ atoms/cm$^2$ and an implantation energy of 160 keV. The roughness was measured using an atomic force microscope (AFM, SPA-360, manufactured by Seiko Instruments, Inc.) over a 10 μm square area at the target surface or interface.

As is apparent from FIGS. 2 and 3, at each of the preheating temperatures, the roughness at the surface of the SOI layer 6 and the roughness at the interface between the SOI layer 6 and the BOX layer 4 was decreased relative to the case in which preheating was not carried out (30° C.). The lowest roughness was obtained at a preheating temperature of 90° C. Although the reasons are not clear, this presumably has something to do with changes caused by the preheating temperature in the extent of the amorphous layer-forming region in the depth direction, or in the nature of the amorphous layer (i.e., in the volume fraction of amorphous silicon and crystalline silicon within the amorphous layer).

Figure 4:
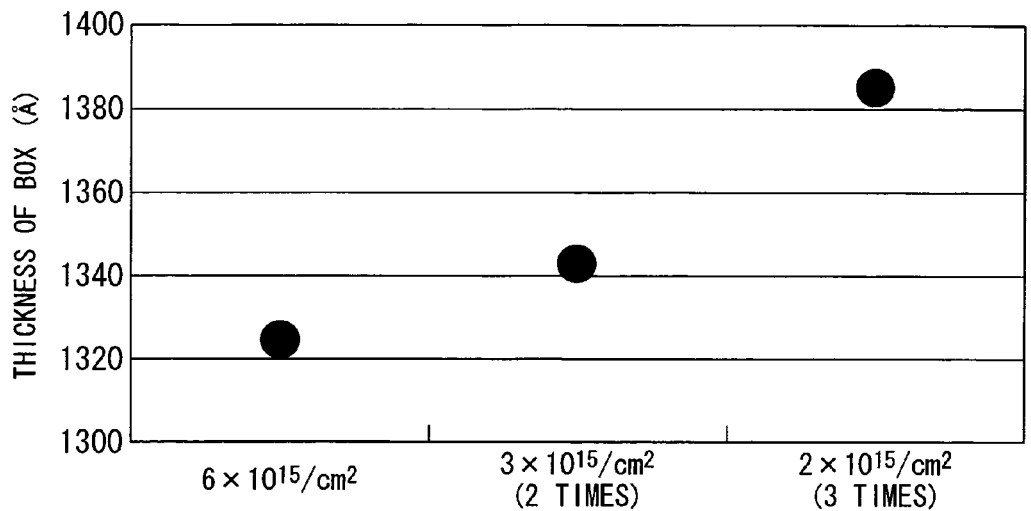
FIG. 4 is a graph showing the relationship between the number of implantation of oxygen ions in the forming of the amorphous layer and the thickness of the BOX layer in the method for manufacturing a SIMOX wafer by a MLD-SIMOX process in accordance with the present invention.

Next, with regard to SIMOX wafers obtained under conditions in which in the second implantation of oxygen ions (the forming of the amorphous layer 3), oxygen ions are implanted in at most three fractions, the thickness (Å) of the BOX layer 4 is described while referring to FIG. 4. The thicknesses of the BOX layers 4 were determined in the case in which oxygen ions were implanted in a single implantation at a dose amount of oxygen ions of $6 \times 10^{15}$ atoms/cm$^2$; in the case in which oxygen ions were implanted in two fractions and the dose amount of oxygen ions in each fraction was $3 \times 10^{15}$ atoms/cm$^2$; and in the case in which oxygen ions were implanted in three fractions and the dose amount in each fraction was $2 \times 10^{15}$ atoms/cm$^2$. In each case, the preheating temperature was set to 90° C., and other conditions were same as those for the cases shown in FIGS. 2 and 3.

FIG. 4 is a graph showing the relationship between the number of implantations of oxygen ions in the second implantation and the thickness of the BOX layer in the case in which the implantation of oxygen ions is carried out in a plurality of fractions in the second implantation (the forming of the amorphous layer).

As is apparent from FIG. 4, even though the total dose amount of oxygen ions in each case was the same, as the number of implantations in the second implantation increased, the BOX layer 4 acquired a greater thickness. This can be explained as follows. When oxygen ions are implanted, the temperature of the silicon wafer rises from the preheating temperature. Hence, a rise in the temperature of the silicon wafer can be suppressed more effectively in the case in which the dose amount of oxygen ions to be implanted is divided into a plurality of fractions and a plurality of implantations are carried out at the divided dose amounts (implantation is carried out in a plurality of fractions), compared to the case in which oxygen ions are implanted at one time.

Figure 5:
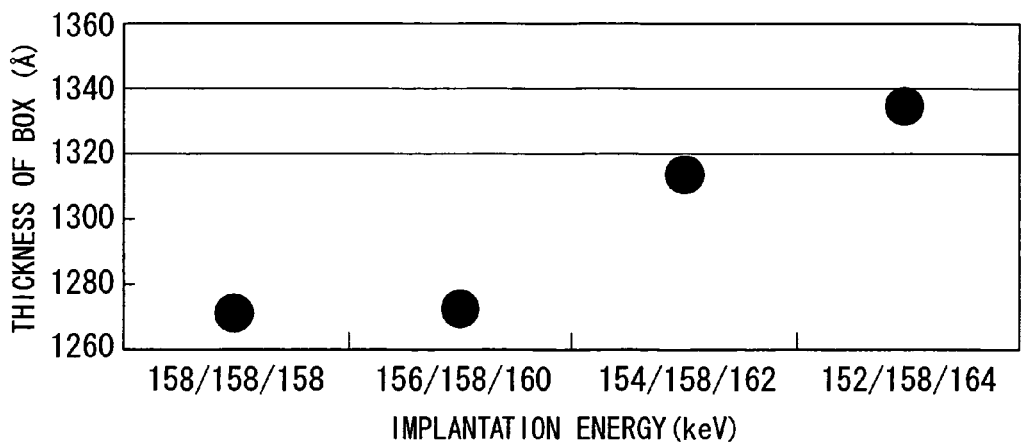
FIG. 5 is a graph showing the relationship between changes of the implantation energy and the thickness of the BOX layer in the case of a plurality of the implantations of oxygen ions are carried out in the forming of the amorphous layer in the method for manufacturing a SIMOX wafer by a MLD-SIMOX process in accordance with the present invention.

Next, the thickness (Å) of the BOX layer 4 is described while referring to FIG. 5 in the case in which, in the second implantation of oxygen ions (the forming of the amorphous layer 3), the oxygen ions are implanted in a plurality of fractions and the implantation energy of any one of the fractions is different from that of other fractions. SIMOX wafers were prepared under conditions in which the preheating temperature was 90° C. and the implantation energy was in a range of 152 to 164 keV, and the thickness of the BOX layer 4 was determined. Specifically, the thickness of the BOX layer 4 was determined in the case in which the implantation energies in the first to third fractions of the implantation were set as follows. The case in which the implantation energies were 156 keV, 158 keV and 160 keV; the case in which the implantation energies were 154 keV, 158 keV and 162 keV; the case in which the implantation energies were 152 keV, 158 keV and 164 keV; and the case in which, for the sake of comparison, the implantation energies were each set uniformly to 158 keV. The other conditions were the same as for the cases shown in FIGS. 2 and 3.

FIG. 5 is a graph showing the relationship between changes of the implantation energy in the second implantation and the thickness of the BOX layer in the case in which the implantation of oxygen ions is carried out in a plurality of fractions in the second implantation (the forming of the amorphous layer). It is apparent from the results in FIG. 5 that, as the difference in the implantation energies for oxygen ions increases, the thickness of the BOX layer 4 becomes thicker. The depth of penetration of oxygen ions is dependent on the implantation energy for oxygen ions. Therefore, by implanting oxygen ions in a plurality of fractions at different energy levels, the amorphous layer 3 is formed at different regions in the depth direction. Thereby, the BOX layer 4 can be made thicker.

As noted above, in the second implantation of oxygen ions, the roughness at the surface of the SOI layer 6 and the roughness at the interface between the SOI layer 6 and the BOX layer 4 can be reduced by, for example, heating the wafer that has been cooled to about room temperature to a specific preheating temperature. An example of the present embodiment has been described in which following the first implantation of oxygen ions, the wafer is preheated to a specific temperature after a natural cooling to close to room temperature. However, other variations are also possible. For example, following the first implantation of oxygen ions, the wafer may instead be subjected to the second implantation of oxygen ions when it is cooled down to a temperature as same as the preheating temperature.

In the present embodiment, the preheating temperature is set to below 300° C., preferably from 30 to 200° C., and more preferably from 50 to 150° C.

By implanting oxygen ions in a plurality of fractions in the second implantation of oxygen ions, the thickness of the BOX layer 4 can be increased at the same total dose amount of oxygen ions (without increasing the total dose amount). Here, the preheating temperatures at the time of each ion implantation are all set to desired preheating temperatures, but the temperature of the wafer gradually rises due to implantation of oxygen ions. It is thus preferable for the temperature of the wafer to be set in a range at which the amorphous layer 3 will grow. For example, it is advantageous to set the upper limit temperature to 300° C., preferably 200° C., and to carry out the second implantation of oxygen ions within a temperature range of the upper limit or less. For example, after finishing one of a plurality of the fractions of implantation, the ion-implantation is halted (the wafer is cooled) until the temperature of the wafer reaches the above-described temperature range. And then, a next fraction of implantation starts while the temperature of the wafer is within the above-described temperature range. In this manner, intervals are set between the fractions of the implantation, thereby, a rise in temperature of the wafer is prevented and oxygen ions are implanted within the above-described temperature range.

Furthermore, in the second implantation of oxygen ions, by implanting oxygen ions in a plurality of fractions and varying the respective implantation energies, the thickness of the BOX layer 4 can be increased. In particular, the BOX layer 4 can be made even thicker by making differences in the implantation energy between the respective fractions of the implantation large. Here, the differences in the implantation energies are typically from 5 to 30 keV, and preferably from 10 to 20 keV.

In accordance with the method for manufacturing a SIMOX wafer of the present embodiment, the roughness at the surface of the SOI layer and the roughness at the interface between the SOI layer and the BOX layer in an MLD-SIMOX wafer can be reduced. This in turn enables the reliable detection of particles and defects which adhere to the surface of the MLD-SIMOX wafer by the inspection. Moreover, since a BOX layer having a given thickness can be formed, it is possible to minimize declines in device characteristics.

Some preferred embodiments of the invention have been described above, although these embodiments are to be considered in all respects as illustrative and not limitative. Those skilled in the art will appreciate that various additions, omissions, substitutions and other modifications are possible without departing from the spirit and scope of the invention as disclosed in the accompanying claims.

What is claimed is:

1. A method for manufacturing a separated by implanted oxygen (SIMOX) wafer, comprising:
    while heating a silicon wafer, implanting oxygen ions so as to form a high oxygen concentration layer within the silicon wafer;
    implanting oxygen ions into the silicon wafer which is obtained by the forming of the high oxygen concentration layer so as to form an amorphous layer in the silicon wafer; and
    heat-treating the silicon wafer which is obtained by the forming of the amorphous layer so as to form a buried oxide (BOX) layer,
    wherein in the forming of the amorphous layer, the implantation of oxygen ions is carried out after preheating the silicon wafer to a temperature lower than the heating temperature of the forming of the high oxygen concentration layer.

2. The method for manufacturing a SIMOX wafer according to claim 1, wherein in the forming of the amorphous layer, oxygen ions are implanted in a plurality of fractions.

3. The method for manufacturing a SIMOX wafer according to claim 2, wherein in the forming of the amorphous layer, each fraction of the implantation of oxygen ions is carried out at an implantation energy different from those of other fractions of the implantation of oxygen ions.

4. A method for manufacturing a separated by implanted oxygen (SIMOX) wafer, comprising:
    while heating a silicon wafer to 300° C. or more, implanting oxygen ions so as to form a high oxygen concentration layer within the silicon wafer;
    implanting oxygen ions into the silicon wafer which is obtained by the forming of the high oxygen concentration layer so as to form an amorphous layer in the silicon wafer; and
    heat-treating the silicon wafer which is obtained by the forming of the amorphous layer so as to form a buried oxide (BOX) layer,
    wherein in the forming of the amorphous layer, the implantation of oxygen ions is carried out after preheating the silicon wafer to a temperature of less than 300° C.

5. The method for manufacturing a SIMOX wafer according to claim 4, wherein in the forming of the amorphous layer, oxygen ions are implanted in a plurality of fractions.

6. The method for manufacturing a SIMOX wafer according to claim 5, wherein in the forming of the amorphous layer, each fraction of the implantation of oxygen ions is carried out at an implantation energy different from those of other fractions of the implantation of oxygen ions.

7. The method for manufacturing a SIMOX wafer according to claim 2, wherein in the forming of the amorphous layer, after finishing one of a plurality of the fractions of implantation of oxygen ions, the implantation of oxygen ions is halted until the temperature of the silicon wafer reaches a temperature range of 300° C. or less, and then, a next fraction of implantation of oxygen ions starts while the temperature of the wafer is within the temperature range of 300° C. or less.

8. The method for manufacturing a SIMOX wafer according to claim 2, wherein in the forming of the amorphous layer, after finishing one of a plurality of the fractions of implantation of oxygen ions, the implantation of oxygen ions is halted until the temperature of the silicon wafer reaches a temperature of 200° C. or less, and then, a next fraction of implantation of oxygen ions starts while the temperature of the wafer is within the temperature range of 200° C. or less.

9. The method for manufacturing a SIMOX wafer according to claim 5, wherein in the forming of the amorphous layer, after finishing one of a plurality of the fractions of implantation of oxygen ions, the implantation of oxygen ions is halted until the temperature of the silicon wafer reaches a temperature of 300° C. or less, and then, a next fraction of implantation of oxygen ions starts while the temperature of the wafer is within the temperature range of 300° C. or less.

10. The method for manufacturing a SIMOX wafer according to claim 5, wherein in the forming of the amorphous layer, after finishing one of a plurality of the fractions of implantation of oxygen ions, the implantation of oxygen ions is halted until the temperature of the silicon wafer reaches a temperature of 200° C. or less, and then, a next fraction of implantation of oxygen ions starts while the temperature of the wafer is within the temperature range of 200° C. or less.

* * * * *